United States Patent
Makke et al.

(10) Patent No.: US 11,928,406 B2
(45) Date of Patent: Mar. 12, 2024

(54) SYSTEMS AND METHODS FOR CREATING INFRASTRUCTURE MODELS

(71) Applicant: Ford Global Technologies, LLC, Dearborn, MI (US)

(72) Inventors: Omar Makke, Lyon Township, MI (US); Oleg Gusikhin, Commerce Township, MI (US); Andrew Gliesman, Dearborn, MI (US); Bardia Madani, Northville, MI (US); Sina Fakhraee, Canton, MI (US); David Kramer, Clarkston, MI (US); Melinda Kaye Hunsaker, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 923 days.

(21) Appl. No.: 16/919,455

(22) Filed: Jul. 2, 2020

(65) Prior Publication Data
US 2022/0004685 A1     Jan. 6, 2022

(51) Int. Cl.
*G06F 30/22*     (2020.01)
*G06F 30/13*     (2020.01)
(Continued)

(52) U.S. Cl.
CPC .............. *G06F 30/22* (2020.01); *G06F 30/13* (2020.01); *G07C 5/008* (2013.01); *G08G 1/017* (2013.01);
(Continued)

(58) Field of Classification Search
CPC ......... G06F 30/22; G06F 30/13; G07C 5/008; G08G 1/017; G08G 1/04; G08G 1/056;
(Continued)

(56) References Cited

U.S. PATENT DOCUMENTS 8,139,115 B2 *   3/2012   Barnes ............... G08G 1/017
                                           348/148
10,662,696 B2 *  5/2020   Bradley ............. G05D 1/0088
                         (Continued)

FOREIGN PATENT DOCUMENTS

AU       776448 B2      9/2004
CN    109446588 A       3/2019

OTHER PUBLICATIONS

Jose L. Lima, et al., "PLC and Petri Net Training Based On A 3D Virtual Car Park Modeling and Control", 9 pages.
(Continued)

*Primary Examiner* — Kurt Philip Liethen
(74) *Attorney, Agent, or Firm* — Brandon Hicks; Eversheds Sutherland (US) LLP

(57) ABSTRACT

Systems and methods are provided herein for creating and building a model of a unique infrastructure, such as a parking structure. The model may be created through the identification of various triggers by a vehicle traversing the infrastructure. The triggers may include, for example, sensors or other devices capable of sensing the vehicle within the infrastructure. The triggers may also be information received from the vehicle itself. Based on the triggers, it may be inferred that various places exist throughout the infrastructure. For example, it may be inferred through two subsequent triggers that a place exists between the two triggers. The place may be added to the model of the infrastructure in between the two triggers. The model may continue to grow in this manner.

18 Claims, 5 Drawing Sheets

(51) Int. Cl.
*G06V 20/54* (2022.01)
*G07C 5/00* (2006.01)
*G08G 1/017* (2006.01)
*G08G 1/04* (2006.01)
*G08G 1/056* (2006.01)
*H04W 4/02* (2018.01)
*H04W 4/38* (2018.01)
*H04W 4/44* (2018.01)

(52) U.S. Cl.
CPC .............. *G08G 1/04* (2013.01); *G08G 1/056* (2013.01); *H04W 4/027* (2013.01); *H04W 4/38* (2018.02); *H04W 4/44* (2018.02); *G06V 20/54* (2022.01)

(58) Field of Classification Search
CPC .... G08G 1/0129; G08G 1/143; G08G 1/0116; G08G 1/148; H04W 4/027; H04W 4/38; H04W 4/44; G06V 20/54
See application file for complete search history.

(56) References Cited

U.S. PATENT DOCUMENTS

| | | | |
|---|---|---|---|
| 11,125,577 B2 * | 9/2021 | Alneghaimish | G08G 1/096816 |
| 11,157,746 B2 * | 10/2021 | Lehn | G06V 20/586 |
| 2011/0288684 A1 * | 11/2011 | Farlow | B25J 19/023 |
| | | | 901/1 |
| 2014/0114556 A1 * | 4/2014 | Pan | G08G 1/0129 |
| | | | 701/119 |
| 2015/0127239 A1 * | 5/2015 | Breed | G01S 19/13 |
| | | | 701/70 |
| 2016/0189544 A1 * | 6/2016 | Ricci | G08G 1/096725 |
| | | | 701/117 |
| 2017/0103589 A1 * | 4/2017 | Makke | G07C 5/06 |
| 2017/0123429 A1 * | 5/2017 | Levinson | G01S 17/87 |
| 2018/0072190 A1 * | 3/2018 | Kowalski | H04W 12/06 |
| 2019/0291721 A1 * | 9/2019 | Sakano | G06V 20/64 |
| 2019/0304306 A1 * | 10/2019 | Michalakis | G08G 1/146 |

OTHER PUBLICATIONS

Wil Van Der Aalst, et al., "Course Business Information Systems Exercises", published Jan. 24, 2012.

Paulo Barbosa et al., "Checking Semantics Equivalence of MDA Transformations in Concurrent Systems", Journal of Universal Computer Science, vol. 15, No. 11, Jan. 2009, Federal University of Campina Grande, Campina Grande, Brazil, pp. 2196-2224.

L. Gomes, et al., "Structuring and Composability Issues in Petri Nets Modeling", published May 2, 2005.

* cited by examiner

SYSTEMS AND METHODS FOR CREATING INFRASTRUCTURE MODELS

TECHNICAL FIELD

The present disclosure relates to systems and methods for creating infrastructure models, and more particularly relates to creating infrastructure models using Petri nets.

BACKGROUND

Current mobility and parking solutions for various parking infrastructures (e.g., parking garages) may rely on information received from cameras or sensors on one or more vehicles, the infrastructure itself, or a combination thereof. These solutions may also integrate vehicle, cloud, and infrastructure systems together in order to help facilitate the parking of one or more vehicles in the infrastructure. However, such solutions may present challenges given that numerous parking structures may exist, and each parking structure may provide its own unique challenges.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

Figure 1:
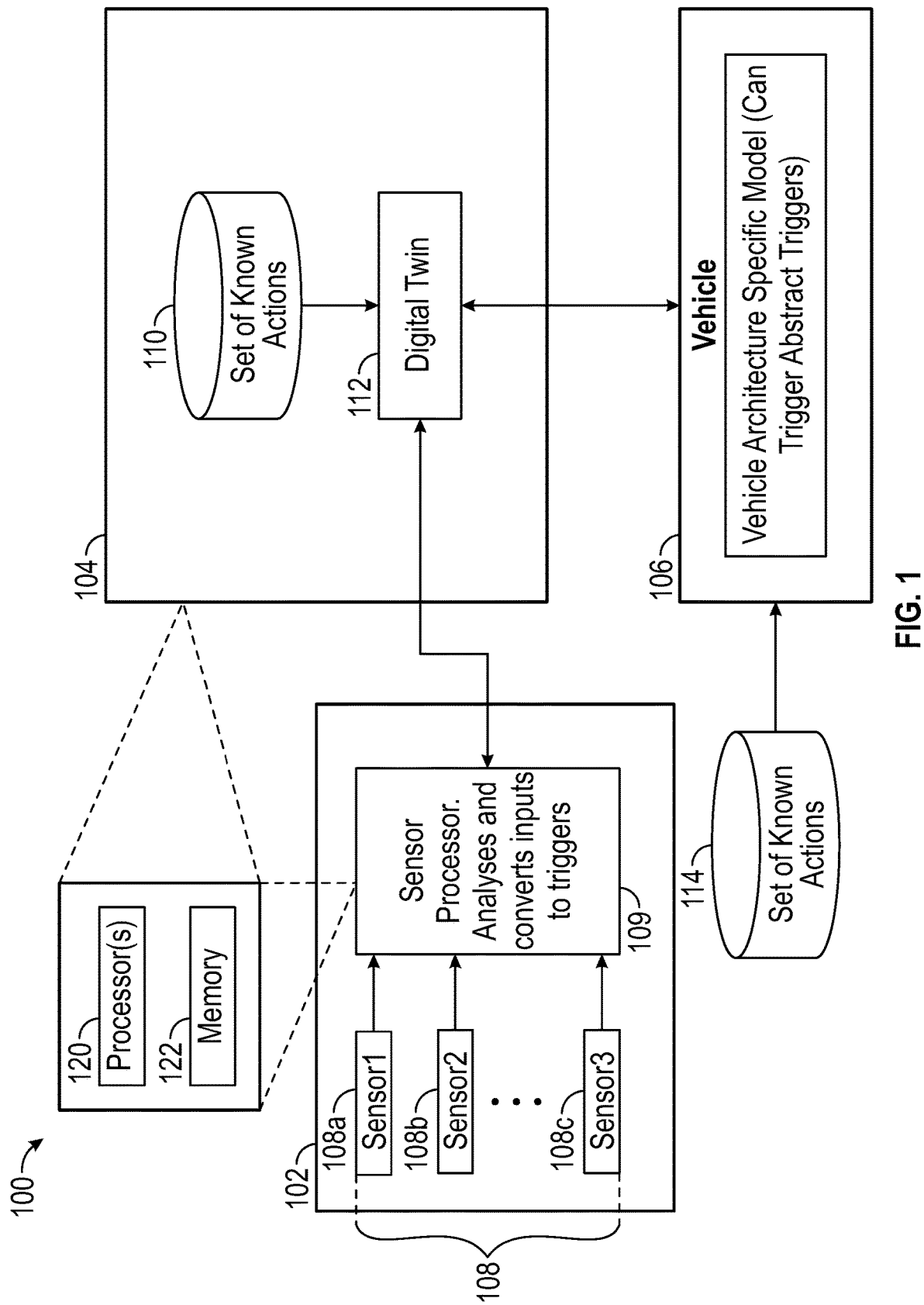
FIG. 1 depicts an example system architecture, in accordance with one or more example embodiments of the disclosure.

The disclosure is directed to systems and methods for creating infrastructure models, which, for example, may be a Petri-net model. The systems described herein may have the benefit of quickly building a model of a unique infrastructure (for the sake of simplicity, the term "parking structure" may be used herein, but any other type of infrastructure may be equally applicable). For example, a first parking structure may have three parking levels, an exit, and an entrance, and a second parking structure may have four parking levels, and two external parking lots. In addition to the structure having different types of physical configurations, it may have different types of sensing capabilities and those capabilities may be arranged differently even when the physical structures are the same. For example, if a structure is a multi-level facility, one structure may have cameras only at an entrance, another may have cameras at every floor. Alternatively, one structure may have cameras and another structure could have different types of sensors other than cameras. The mix of sensors can vary as well. Knowing the configurations and being able to dynamically model these configurations enables the ability offer a variety of services including, but not limited to, shuttle services. This is because having the ability to understand the structure, sensing capabilities, and vehicles moving in and out of the area of the structure, it is possible to predict and anticipate needs of vehicle occupants in advance and offer up services like shuttling. A vehicle or driver of a vehicle (depending on whether the vehicle is an autonomous vehicle ("AV") or not) may use a model of the parking structure to make various determinations with respect to the parking structure. For example, such determinations may involve how to navigate the parking structure. Additionally, the model of the parking structure may allow for data collection regarding current occupants of the parking structure (e.g., to allow a vehicle or driver of a vehicle approaching the parking structure to obtain information about the current capacity of the parking structure) and other information regarding the parking structure, such as parking rules. All of this information may serve to enhance an AV or driver's interaction with a parking structure.

The infrastructure model creation may first entail an initialization process. That is, in order for the model to be created, certain information associated with the parking structure may first need to be obtained and/or determined. The initialization process for a given parking structure, for example, may involve collecting information about any sensors and/or other types of data capture devices (e.g., cameras, ultrasonic sensors, optical sensors, etc.) that are currently located within the parking structure. For example, one camera may be located at the entrance to a first level and one camera may be located at the entrance to the second level. In this example, information about the two cameras may be collected and stored and a data communication link may be established with the cameras so that any information captured by the cameras may be stored as well. Such information may be stored at a computing system located locally to the parking structure, and/or may be stored remotely on the cloud or other remote computing device, such as a remote server. Once the sensors and/or other types of data capture devices within the parking structure are identified, the model creation may begin. Model creation may involve capturing data from the identified sensors and/or other types of data capture devices as a vehicle (e.g., a probe vehicle) (or any number of vehicles) traverses through the parking structure.

As the vehicle traverses the parking structure, the sensors and/or other types of data capture devices may track the movement of the vehicle and register various triggers. A trigger may include an indication that the vehicle was identified by one of the sensors and/or other types of data capture devices within the parking structure. For example, one trigger may involve a camera in the parking structure indicating it has captured the vehicle in its field of view. A second trigger may involve a second camera in the parking structure indicating it has captured the vehicle in its field of view. Triggers may also not be limited to the sensors and/or other types of data capture devices of the parking structure. That is, the vehicle may also be a source of triggers as well. Examples of vehicle triggers may include the orientation of the vehicle's steering wheel (e.g., whether the vehicle is making a left or right turn), the gear selection of the vehicle (e.g., park, drive, reverse), whether the vehicle is ascending or descending, etc. These triggers may be more abstract in nature than the triggers received from the physical sensors located in the parking structure. All of these, and various other types of triggers may be received and utilized in the creation of the model.

A trigger may be associated with a sensor in the parking structure (or any other element capable of registering a trigger, for example, a vehicle) using an Application Programming Interface (API). The API may allow for the interaction of unconstrained end systems to communicate back to the model in a standardized way to enable the desired functioning of event triggers within the model The API may use open standards such a REST enabled calls as a means of establishing interoperability with current and future sensing devices. In the event a sensing device cannot perform a REST call, an intermediary hardware/software (e.g., edge system) solution could reside between that end system and act as the end point ambassador to the solution's API. When a new sensor is installed, it may be setup to communicate with the edge system. Any newly added information about any sensors in the parking structure may auto generate a REST end point, and this information, along with sensor information, may be sent to the edge system. The edge system may then uses the newly added sensor to trigger a specific REST API. In some instances, any of the systems and/or devices (e.g., end system, edge system, etc.) may be interchangeable and/or may also be incorporated into a single system and/or device. The triggers may also be provided an associated defined meaning, such as "Entering," "Exiting," "Parking," etc. The various triggers may be used in the creation of the model by identifying "places" within the parking structure. A place may be any location within the parking structure, such as, for example, a level of a parking structure, an external parking lot, or any other physical location within the parking structure that the vehicle may traverse. A place may be identified when two subsequent triggers are received. That is, a first trigger may indicate that the vehicle was identified by a first camera, and a second trigger may indicate that the vehicle was identified by a second camera. Based on the vehicle being identified by these two different cameras, it may be inferred that a place exists between the two cameras. Thus, the model may be updated to include the place in between the two cameras that were triggered back-to-back. The model may continue to grow in this manner. For example, after the trigger from the second camera, a trigger from a third camera may be received. This may indicate that a second place exists between the second camera and the third camera. This second place may be added to the model so that the model now includes the three cameras and the two places. Additionally, the triggers may not be limited to cameras identifying the vehicle. As one example, any other type of sensor may identify the vehicle (e.g., ultrasonic sensor), and triggers may also be received from the vehicle, as well as any other element with data collection and communication capabilities (e.g., other vehicles in the parking structure).

As mentioned above, triggers may also be received from vehicles. Any data produced by any of the triggers, whether from infrastructure or vehicles, may be in standard format, value, syntax, and semantic meaning that can be used or incorporated into a local or cloud store. Such triggers may be more abstract in nature instead of associated with physical infrastructure elements such as cameras or other types of sensors or devices. These triggers may serve to supplement the triggers received from physical infrastructure elements in creating the model (e.g., a vehicle trigger indicating the vehicle is ascending may lead to a determination that the vehicle is entering a different level of the parking structure), and may also be used by the vehicle itself in performing navigation using a digital twin, which may be a duplicate of the model provided to the vehicle for on-board vehicle-based processing as opposed to infrastructure processing (the digital twin is described in further detail with respect to FIG. 1 below). One example of a vehicle trigger may include an indication of a gear shift (e.g., from park to drive or from drive to park). A second example of a vehicle trigger may include an indication of a left turn or a right turn, which may be determined by steering wheel location. A further example of a vehicle trigger may include an indication that the vehicle is either ascending or descending (e.g., as determined by an accelerometer of the vehicle).

This process of tracking vehicles within the parking structure and identifying triggers and new places may be performed through a number of iterations before a final working model of the parking structure is obtained. Additionally, even after the final working model is obtained, the model of the parking structure may be continuously updated as changes are made to the parking structure (e.g., if the parking structure undergoes construction) and/or new sensors and/or other types of data capture devices are added to the parking structure. For example, a new level may be added to the parking structure, along with an additional camera located at the new level. The new camera may be added to the model through in a similar manner to which the original sensors and/or other data capture devices were added during the initialization process. The new camera may also be added through communications with a vehicle that is identified by the new camera, or by a vehicle that identifies the new camera through its own sensing devices. Thus, the model may not be static, but instead may be constantly updating based on new information.

Any of the processing described herein may be performed at the parking structure itself, or may be performed remotely, for example at a remote server or other cloud-computing platform. The processing, however, may also occur at the vehicle. In such cases, vehicle processing may be accomplished by providing the model to the vehicle in the form of a "digital twin," which may be a duplicate of the current model of the parking structure. Any subsequent changes to the model may also be provided to the vehicle by the system in real-time. The vehicle may then use the model to traverse the parking structure. The vehicle may also use its own sensors and/or other devices to assist in traversing the parking structure. For example, the vehicle may use an on-board accelerometer to determine that it is ascending and/or descending to a new level of the parking structure. As another example, the vehicle may use cameras, LIDAR, RADAR, ultrasonic sensors, or other types of sensors to detect objects, such as other vehicles in the parking structure. The vehicle may also communicate with any of the sensors and/or other devices in the parking structure, and/or any of the other vehicles in the parking structure, to assist in traversing the parking structure. These are merely examples and not intended to be limiting.

In some embodiments, the model may be in the form of a Petri Net or a Colored Petri Net. Colored Petri Nets may be abstract models used to model asynchronous processes, and may be helpful to identify resource constraints, limitations, and identify potential dead-locks. Colored Petri Nets may have standardized XML description which allows them to be transported from one system to another. Petri Nets may involve defining places and transitions. Additionally, Colored Petri Nets may extend the model capabilities to allow the distinction between triggering events, and hence increasing the scope of what can be simulated.

As mentioned above, there may be numerous benefits to this modeling process. The model may be beneficial in providing information to the parking structure as well as vehicles interacting with the parking structure. The parking structure may be able to identify, using the model and/or data received about triggers from sensors and/or other devices within the parking structure, triggers from vehicles, or any other data from the vehicles, information about the status of the parking structure. For example, based on the number of triggers received regarding one of the cameras in the parking structure, the system may be able to identify how many vehicles are currently parked and/or located within a particular place within the parking structure. In some instances, a counter may be associated with a particular place, such that when a trigger indicates that the counter is increased when a trigger indicates the vehicle has entered the place, and the counter is decreased when a trigger indicates that the vehicle has left the place. The system may also use information from the vehicles (e.g., the aforementioned vehicle triggers) to determine information such as which vehicles are parked and which vehicles are merely traversing a place in the parking structure. This information may be provided to other vehicles to make determinations with respect to the parking structure, such as whether there is a sufficient number of parking spaces for the vehicle to enter the parking structure and find an open parking spot. Example of other types of information may include rules associated with the parking structure (e.g., if the parking structure is a 2 hour parking structure), information about construction occurring in and/or around the parking structure, or any other static or dynamic information associated with the parking structure.

The model may also be beneficial in assisting vehicles in traversing the parking structure. In one embodiment, the system may maintain the model, receive triggers and other information from the parking structure sensors and/or other devices, as well as information from the vehicle, and may provide navigation instructions to the vehicle based on some or all of this information. For example, the system may determine that a first camera at an entrance of the parking structure has been triggered indicating that the vehicle entered the parking structure. The system may instruct the vehicle to turn left towards an empty portion of the parking structure to find an open parking spot.

Illustrative Embodiments

Turning now to the drawings, FIG. 1 depicts an illustrative system 100 in which techniques and structures of the present disclosure may be implemented. The illustrative system 100 is exemplary and not intended to be limiting. The illustrative system 100 may include parking infrastructure 102 and one or more computing systems 104, which may be located locally with respect to the parking infrastructure 102 or may be remote (e.g., such as a remote server or other cloud-computing platform). Additionally, one or more vehicles 106 may be included within the system 100. In some instances, such vehicles may be autonomous vehicles ("AVs"). Although not depicted in FIG. 1, the system 100 may also include one or more "places" may also include a communications network (which both may be described in further detail with reference to FIG. 2).

The parking infrastructure 102 may include may include one or more sensors 108 or other data collection devices (e.g., sensor 108(a), sensor 108(b), and/or sensor 108(c)) (hereinafter referred to as "sensors 108" for simplicity). The sensors 108 may include any physical infrastructure elements that are included within the parking infrastructure 102. For example, the sensors 108 may include any type of data collection device, such as, a camera, LIDAR system, RADAR system, ultrasonic sensor, proximity sensor, optical sensor, etc. These sensors 108 may be located throughout the parking infrastructure 102 and may be used to collect data about the parking infrastructure 102, as well as anything found within the parking infrastructure 102 at any given time, including any vehicles 106 traversing, or parked in, the parking infrastructure 102. These sensors 108 may also serve to provide some or all of the aforementioned triggers that may be used to create the model of the parking infrastructure 102. As one example, a first sensor 108(a) may include a camera located at the entrance to the parking infrastructure 102. The first sensor 108(a) may capture images of vehicles entering the parking infrastructure 102, and may trigger when a vehicle is identified by the first sensor 108(a). Information about the sensors 108 included within the parking infrastructure 102 may be provided at the outset of the model creation, that is the sensors 108 that exist within the parking infrastructure 102 may be known. Additionally, sensors that are added to the parking infrastructure (e.g., if a new camera is installed) can be identified and added to the model.

The parking infrastructure 102 may also include an edge system 109. In some instances, however, the edge system 109 may simply be the same as the computing system 104 described below. As described above, the edge system 109 may be an intermediary hardware/software solution could reside between the computing system 104 (e.g., end system) and act as the end point ambassador to the solution's API.

In general, the computing system 104 may include set of known actions 110 and a digital twin 112, which may be provided to the vehicle 106. The computing system 104 may be an agent which communicates with the parking structure 102 and/or the vehicle 106. The owners configure the sensors 108 and make sure the APIs are set up in the model 104, so that the model can receive the triggers. Once the model is trained using the infrastructure data, the vehicle 106 can communicate with the computing system 104 and obtain a copy of the infrastructure model. The vehicle may use this model to inform a driver of the vehicle or the computing system 104 about the location of available parking spots in the parking structure. In the case where the cloud model is trained by a probe vehicle (e.g., an initial vehicle used to gather data about and develop a model for a particular parking structure), the probe vehicle tracks its location with the infrastructure, and triggers APIs in the computing system 104 whenever actions are detected. This may enable the computing system 104 to transform the infrastructure triggers to vehicle-based triggers. This transformed model may then be used by other vehicles in the parking infrastructure, and they may then know when to fire a specific trigger. For example, the probe vehicle may determine that before making a left turn, the probe vehicle drove 40 meters. This information may be sent to the computing system 104. The computing system 104 processes this information and may keep information that is not redundant (e.g., do not fire at almost the same time as the infrastructure's triggers). These triggers may be stored in the computing system 104 and also may be deployed to other vehicles. Any new vehicle receiving the transformed model may understand that if after driving 40 meters through a given entrance, a left turn is made, a trigger is fired, hence indicating that the vehicle has moved from one place to another in the parking structure. In the case where it is not possible to use a probe vehicle, the model may first be trained based on the infrastructure sensors. After the training phase, the computing system 104 may transform the vehicle's model so that it fires a generic API indicating the action. Then using unsupervised learning on large set of data, the cloud identifies which action is detected most of the time between two infrastructure triggers, hence enhancing the model. The newly detected action (or set of actions) becomes part of the model. The process may repeat until no more correlations can be found.

The set of known actions 110 may include a defined set of all possible actions related to parking structures, which may be associated with the triggers. This set may be known by the vehicle and infrastructure. An action may be a common language, or common interface between the cloud and the vehicle. An abstract trigger may be the output of processing a collection of a vehicle's specific signals, which may vary between vehicles. The output may tie to a corresponding action, which may be predefined. For example, the actions "Entering," "Exiting," "Ascending," and "Descending" are descriptions which give subjective meaning to the triggers, and also provide classification for the triggers. There may be several triggers which detect "Entering" or "Exiting" an infrastructure. A vehicle may look at its GPS signal and maps to infer that it is entering or leaving a parking infrastructure. Therefore, actions may be designated for coordinating the processing of vehicle signals (e.g., abstract triggers) with cloud triggers, via actions. In another example, different vehicles may rely on different sensors and signals to detect that the vehicle is ascending or descending. Vehicles may use steering wheel angle or compass to infer or detect directionality of the vehicle. In this case, the abstract triggers are the steering wheel angle and the measured direction, and the actions can be "Heading North", "Turning Left". Suppose a vehicle receives a model of the parking's digital twin. As the vehicle navigates the parking infrastructure, it processes its implementation specific signals (abstract triggers) to detect actions such as "Turning Left," "Turning Right," "Heading North," and sends them to the cloud. The cloud then starts assuming there are additional triggers, triggered by the vehicle's actions. This way, the cloud does not need to know about the actual vehicle signals and how to process them.

The digital twin 112 may be a duplicate of the model provided to the vehicle for on-board vehicle-based processing as opposed to infrastructure processing. The digital twin 112, being a digital representation of the physical world, could display relevant information to various audiences who have specialized interests. For example, safety and security personnel may be interested in occupancy for one perspective while maintenance of the facility may be interested in the information for repairs, servicing, and other reasons. The digital twin 112 can be used to not only monitor status in real time and historically, it could be used to introduce what-if scenarios where the various people interacting with the digital twin could force new behaviors back on the structure itself. For example, if the physical safety and security desires to quarantine a section of the lot, or artificially close a lot, they could send back to the model data which represents spots being consumed though they may be empty. For all intents and purposes however, all audiences of the digital twin 112 and the model itself could perceive the area as if occupied in this example scenario. Additionally, as the state of the infrastructure changes, due to vehicles entering or leaving for example, the digital twin 112 in the cloud may update the information and push the updated information to remote entities such as the vehicles.

In some embodiments, any element of the system, for example such as the edge system 109 and the computing system 104 may comprise at least one or more processor(s) 120 and memory 122. A processor 120 may include any suitable processing unit capable of accepting digital data as input, processing the input data based on stored computer-executable instructions, and generating output data. The computer-executable instructions may be stored, for example, in data storage and may include, among other things, operating system software and application software. The computer-executable instructions may be retrieved from the data storage and loaded into the memory 122 as needed for execution. The processor 120 may be configured to execute the computer-executable instructions to cause various operations to be performed. Each processor 120 may include any type of processing unit including, but not limited to, a central processing unit, a microprocessor, a microcontroller, a Reduced Instruction Set Computer (RISC) microprocessor, a Complex Instruction Set Computer (CISC) microprocessor, an Application Specific Integrated Circuit (ASIC), a System-on-a-Chip (SoC), a field-programmable gate array (FPGA), and so forth.

The memory 122 may be volatile memory (memory that is not configured to retain stored information when not supplied with power) such as random access memory (RAM) and/or non-volatile memory (memory that is configured to retain stored information even when not supplied with power) such as read-only memory (ROM), flash memory, and so forth. In various implementations, the memory 122 may include multiple different types of memory, such as various forms of static random access memory (SRAM), various forms of dynamic random access memory (DRAM), unalterable ROM, and/or writeable variants of ROM such as electrically erasable programmable read-only memory (EEPROM), flash memory, and so forth.

Additionally, any of the aforementioned elements of the computing system 110 (e.g., the processor 12 and/or memory 122 may be included in any of the other elements of the illustrative system 100, such as the vehicle 106, the sensor 102(a), etc.

Figure 2:
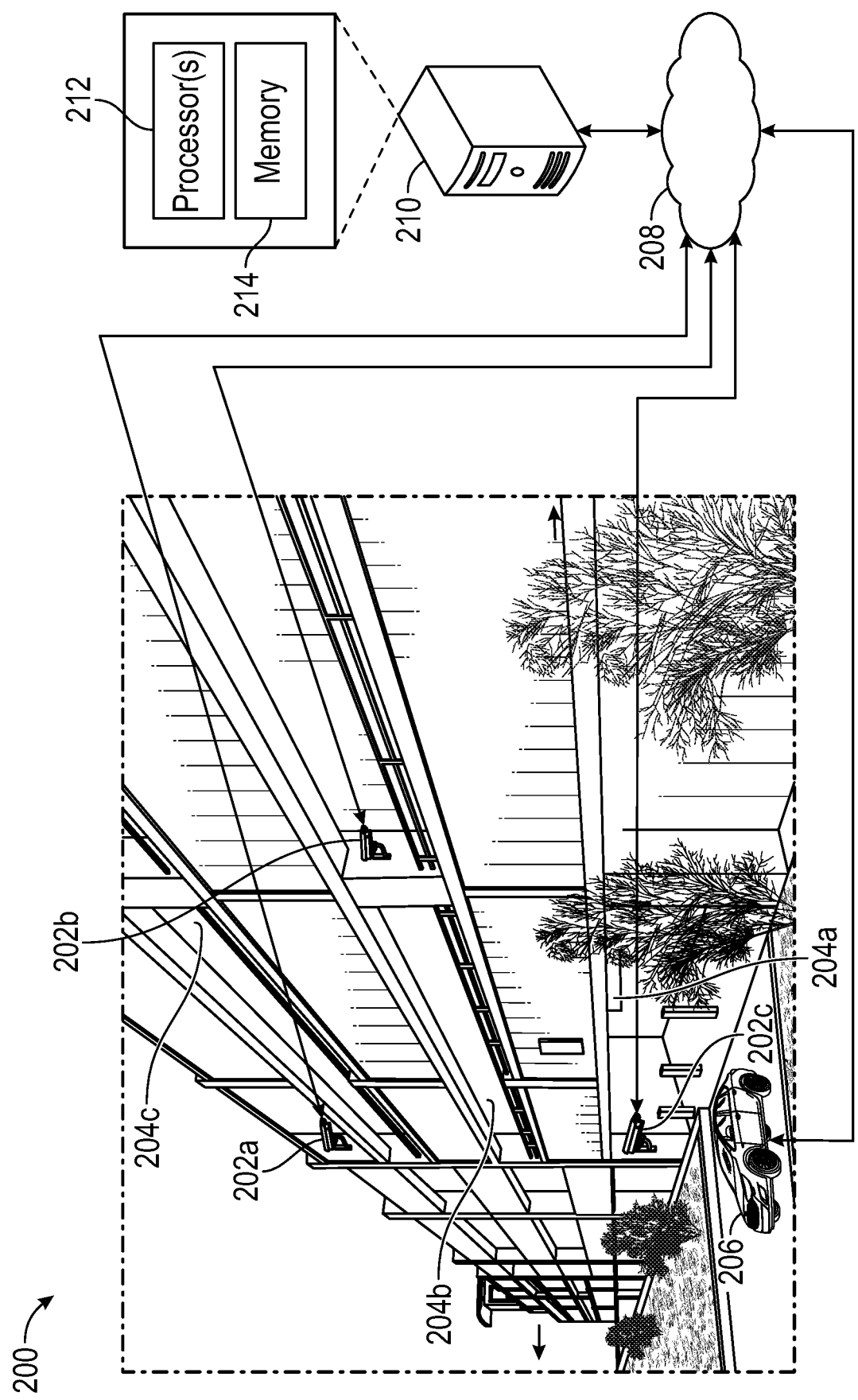
FIG. 2 depicts an example system architecture use case, in accordance with one or more example embodiments of the disclosure.

FIG. 2 depicts an example system architecture use case. In particular, FIG. 2 may depict a unique parking structure 200 implementing the systems and methods described herein. The parking structure 200 may include one or more sensors (e.g., sensors 202(a), 202(b), and (202(c)) (hereinafter referred to as "sensors 202" for simplicity), one or more places (e.g., places 204(a), 204(b), and (204(c)) (hereinafter referred to as "places 204" for simplicity), one or more vehicles 206, one or more communications network 208, and a computing device 210.

The sensors 202 may be the same as the sensors 102 described with reference to FIG. 1. In the particular use case depicted in FIG. 2, the sensors include three cameras located at various levels of the parking structure 200. For example, sensor 202(c) is located at the first level entrance to the parking structure, sensor 202(b) is located at the second level of the parking structure 200 and sensor 202(a) is located at a third level of the parking structure 200.

The places 204 may also be the same as the places described with reference to FIG. 1. The places 204 may include physical locations within the parking structure 200. For example, a place may be a parking level of the parking structure 200, an entrance, an exit, a separate parking lot, or any other type of physical location that a vehicle may traverse. With respect to the creation of the model of the parking structure, a place may simply be defined as a location that may exist between two subsequent triggers. If a vehicle is traversing the parking structure 200 and a first trigger is received, and then subsequently a second trigger is received, it may be inferred that a place must exist between the two triggers. For example, when sensor 202(c) may be triggered and then subsequently sensor 202(b) may be triggered. Based on these two triggers, it may be determined that a place exists between sensor 202(c) and 202(c) (for example, this may be the first level of the parking structure defined by place 204(a)).

The communications network 108 may also be the same as the communications network described with respect to FIG. 1. The communications network 108 may include any one or a combination of multiple different types of networks, such as cable networks, the Internet, wireless networks, and other private and/or public networks. In some instances, the communications network 104 may include cellular, Wi-Fi, or Wi-Fi direct. In some embodiments, the network may involve communications between vehicles in the network and/or between vehicles in the network and elements external to the network. For example, Vehicle-to-Vehicle (V2V), Vehicle-to-Infrastructure (V2I), Vehicle-to-Everything (V2X), and/or Dedicated Short Range Communications (DSRC), to name a few, may be used.

The computing system 210 may be the same as the computing system 104 described with respect to FIG. 1. The computing system 210 may also be the same as the edge device 109 also described with respect to FIG. 1. That is, the computing system 210 may include one or more processors 212, which may be the same as processors 112, and may also include memory 214, which may be the same as memory 214.

Figure 3:
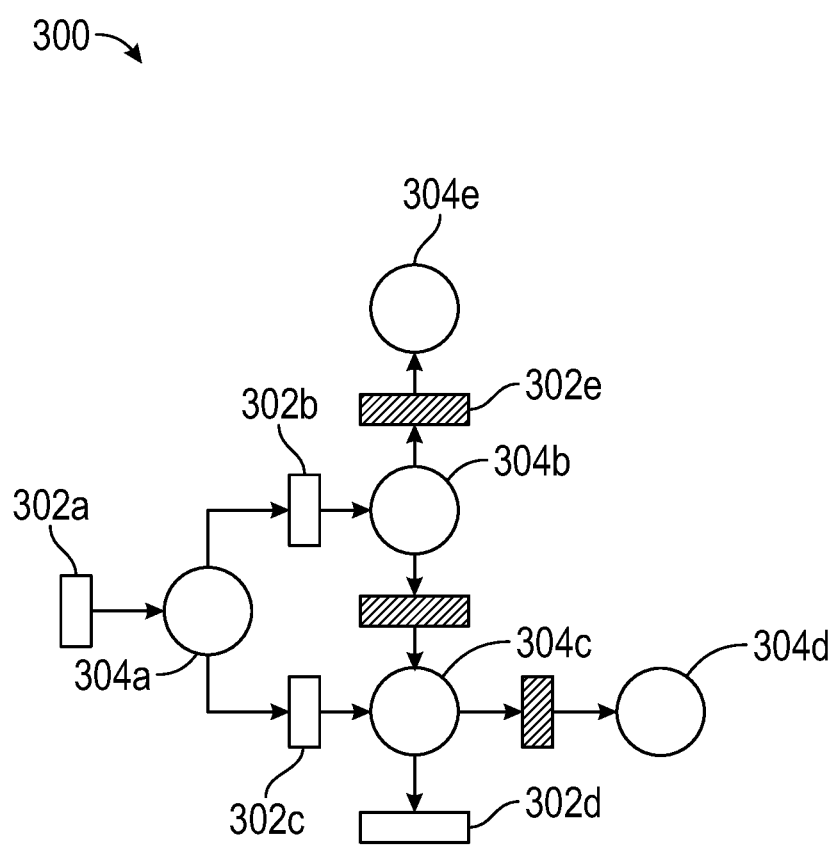
FIG. 3 depicts an example infrastructure model, in accordance with one or more example embodiments of the disclosure.

FIG. 3 depicts an example infrastructure model 300. The model 300 includes various triggers (e.g., 302(a), 302(b), 302(c), etc.) represented as rectangles (in some instances, shaded rectangles may be representative of abstract triggers as described herein), and also various places (e.g., 304(a), 304(b), 304(c), etc.) represented as circles and positioned between the various triggers. For example, place 304(a) is located between trigger 302(a) and trigger 302(b) as well as trigger 302(c). The various triggers (e.g., 302(a), 302(b), 302(c), etc.) may be associated with sensors and/or other types of devices located in a parking structure, or may also be associated with vehicles, such as an indication of a left or right turn. In example infrastructure model 300, trigger 302(a) may be, for example, associated with a camera located at the entrance to the parking structure. Trigger 302(b) may be associated with a camera located at another portion of the parking structure to the left of the entrance, and trigger 302(c) may be a camera located at yet another portion of the parking structure to the right of the entrance. The cameras associated with triggers 302(a), 302(b), and 302(c) may have already been known by the system. However, their location relative to one another may have been unknown. Thus, a vehicle may need to be identified by the camera associated with trigger 302(a) and the camera associated with trigger 302(b) or trigger 302(c) for the model to establish that place 304(a) exists and is located between the camera associated with trigger 302(a) and the cameras associated with trigger 302(b) and 302(c). The same process may be performed until all of the places illustrated in FIG. 3 are identified.

The infrastructure model 300 may also be created based on vehicle triggers and other information received from a vehicle. A vehicle may provide information from its own sensors to assist in the creation of the infrastructure model 300. For example, after trigger 302(b), the vehicle may indicate that it is ascending through data obtained from an on-board accelerometer. This may be represented through trigger 302(e). A trigger could be generated from the infrastructure or inferred (non-discrete) by the model. In order to infer that there is a trigger, the infrastructure may rely on the vehicle to identify specific actions and call any corresponding APIs. The vehicle may receive a transformed model from the computing system indicating when the vehicle should fire a trigger based on an action (as described above). This data may be provided to the system, and may indicate that a higher level of the parking deck is located subsequent to the camera associated with the trigger 302(b). As another example, the vehicle may provide steering wheel information which may indicate that it is taking a right turn after trigger 302(a), and before trigger 302(c). This may indicate that the camera associated with trigger 302(c) is located to the right of the camera associated with trigger 302(a). In some instances, this may also indicate that more than one place may exist between 302(a) and 302(b) and 302(a) and 302(c). Thus, probabilistic information may be included within the model as well, which may be discussed in more detail with reference to FIG. 4 described below.

Figure 4:
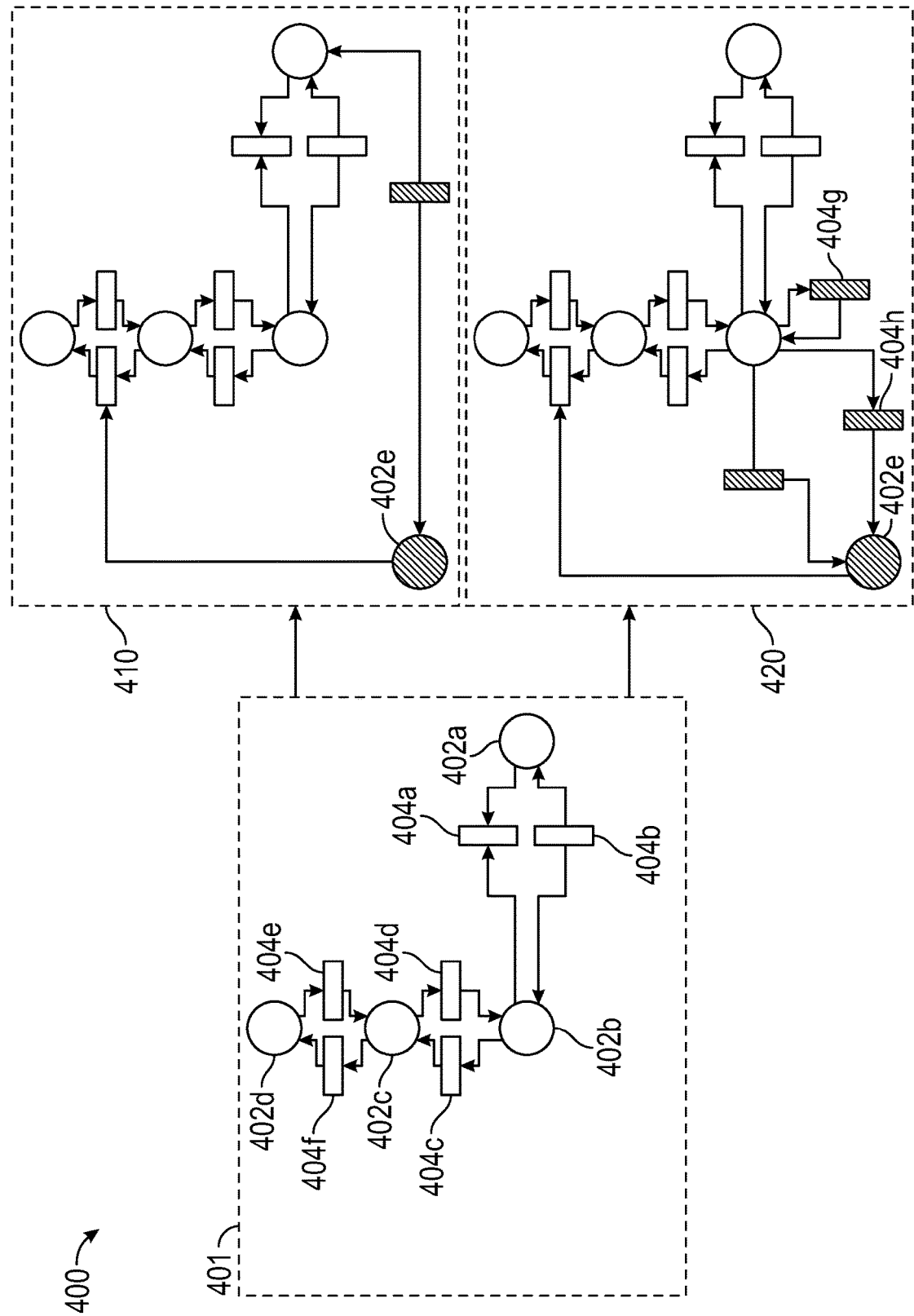
FIG. 4 depicts an example infrastructure model, in accordance with one or more example embodiments of the disclosure.

FIG. 4 depicts an example of an infrastructure model creation progression 400. In particular, FIG. 4 may provide an exemplification of how a model may progress over time. The example model depicted in FIG. 4 may grow according to the processes described herein until model 401 is established. The model 401 may initially include four places, a first place 402(a), a second place 402(b), a third place 402(c) and a fourth place 402(d). The model 401 may also include six triggers, a first trigger 404(a), a second trigger 404(b), a third trigger 404(c), a fourth trigger 404(d), a fifth trigger 404(e), and a sixth trigger 404(f). As depicted in FIG. 4, the model 401 may begin at the first place 402(a). From the first place, the first trigger 404(a) may be received, which may be in the form of a camera facing vehicles driving into the infrastructure depicted in model 401, for example. From the first trigger 404(a), the third trigger 404(c) may be received, which also may be a camera facing towards vehicles driving into the infrastructure of model 401, for example. Based on these two subsequent triggers, it may have been determined that a place exists between the first trigger 404(a) and the third trigger 404(c), which may be the second place 402(b). The same logic applies for the remaining triggers and places in the model 401. Additionally, further information about the various places in model 401 may be gleamed from a number of sources of information, including, but not limited to, vehicle-provided data (e.g., the vehicle indicating that it is ascending from the first trigger 404(a) to the third trigger 404(c)), or infrastructure data, such as the camera associated with the first trigger 404(a) and the camera associated with the third trigger 404(c) indicating that they are located in different levels of the infrastructure depicted by the model 401.

From model 401 FIG. 4 may depict a progression to model 410, which may involve the discovery of a fifth place 402(e). The fifth place 402(e) may be discovered, for example, if the first trigger 402(a) is received and then instead of the third trigger 402(c) being received to indicate that the vehicle has traversed the second place 404(b), the sixth trigger 404(f) is received. This may indicate that an additional place (the fifth place 402(e)) also exists directly after the first trigger 404(a) (in some instances, the shading of the fifth place 402(e) in FIG. 4 may simply serve to indicate that the fifth place 402(e) is a newly-discovered place). It should also be noted that in some instances new cameras and/or other types of sensors may also be incrementally installed in the infrastructure, which may assist in further refinement of the model and identification of places.

From model 401 FIG. 4 may also depict a progression to model 420. Model 420 may be a separate progression from model 401 than the progression from model 401 to model 410. Model 420 may involve the addition of one or more abstract triggers (e.g., triggers 404(g), and 404(h)). As described above, abstract triggers may include triggers from sources other than physical infrastructure sensors such as cameras. In some instances, abstract triggers may instead include data received from a vehicle in the infrastructure associated with model 420. For example, trigger 404(g) may be indicative of a vehicle taking a right turn (the vehicle providing steering wheel data indicating that the steering wheel is turned right), trigger 404(h) may be indicative of a vehicle taking a left turn (the vehicle providing steering wheel data indicating that the steering wheel is turned left), and no trigger may be indicative of the vehicle proceeding forward without making any turns. These abstract triggers may be used to add supplemental information to the model. For example, if a right turn trigger executes (abstract trigger 404(g)), and is always followed by the first trigger 404(a) or the third trigger 404(c), this may mean that the place between the first trigger 404(a) and right turn (the second place 402(b)) may be the same as the place between the first trigger 404(a) and the third trigger 404(c). If left turn trigger executes (abstract trigger 404(h)) and is always followed by the sixth trigger 404(f), that may mean vehicle may be in the new place (e.g., the fifth place 402(e)). If no trigger occurs, probability may be given to each place. For example, as vehicles move from one place to another in the parking structure, a temporal correlation may be created between any received triggers in each place. A correlation square matrix can be generated with the triggers representing rows and columns. If two triggers have high correlation, exceeding a threshold, then a place may be assumed to be in between them. The confidence level may represent how correlated the two triggers are. Once the training is done, the model may then generate the places between the triggers, given the training data, and may be deployed (e.g., to vehicles, parking infrastructure, etc.). Inaccuracies in the model will cause some places to have negative amount of vehicles, which is not possible, and hence the model adjusts its confidence level for the next iteration of training to enhance accuracy from the beginning, the entrance to the parking infrastructure may closed, and a probe vehicle may drive in the infrastructure while traversing every possible transition between the places within the parking infrastructure.

Figure 5:
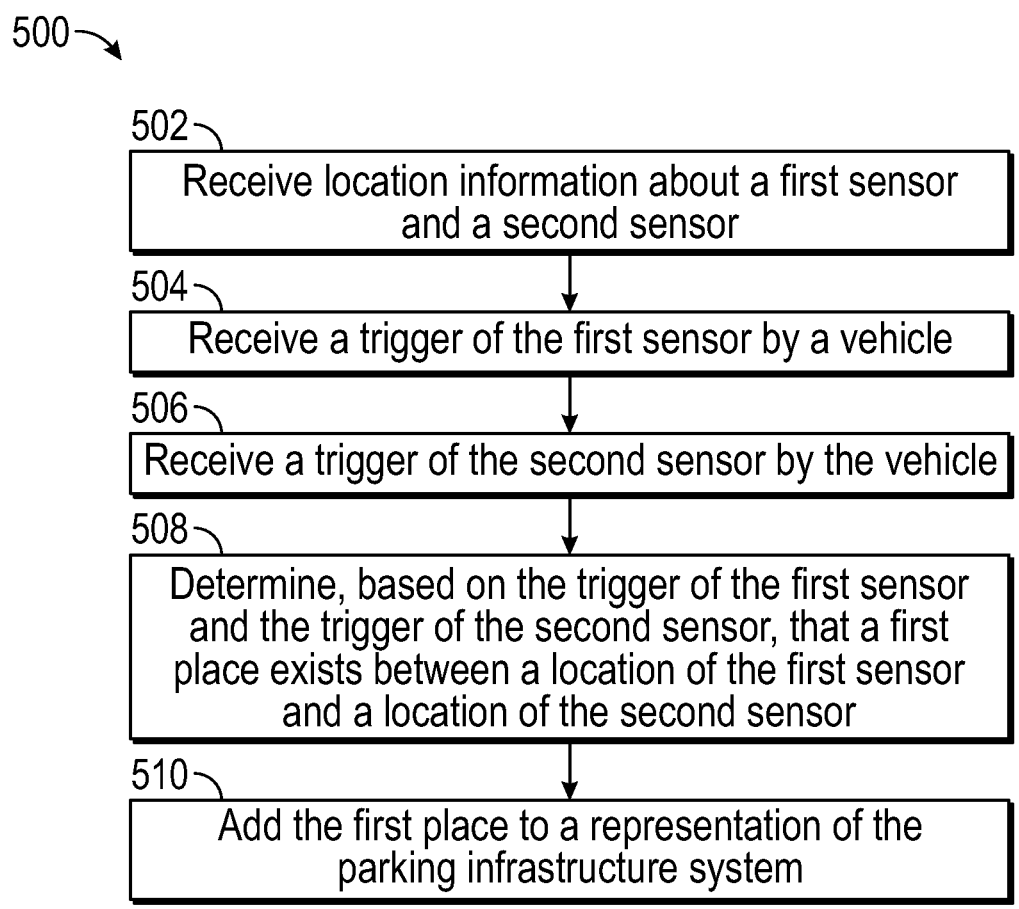
FIG. 5 depicts a flowchart of an example method, in accordance with one or more example embodiments of the disclosure.

FIG. 5 is a flow of an example method of the present disclosure. In some embodiments, the method includes a step 502 of receive location information about a first sensor and a second sensor.

In some embodiments, the method includes a step 504 of receive a trigger of the first sensor by a vehicle.

In some embodiments, the method includes a step 506 of receive a trigger of the second sensor by the vehicle.

In some embodiments, the method includes a step 508 of determine, based on the trigger of the first sensor and the trigger of the second sensor, that a first place exists between a location of the first sensor and a location of the second sensor.

In some embodiments, the method includes a step 510 of add the first place to a representation of the parking infrastructure system.

In the above disclosure, reference may be made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, one skilled in the art will recognize such feature, structure, or characteristic in connection with other embodiments whether or not explicitly described.

Computer-executable instructions comprise, for example, instructions and data which, when executed at a processor, cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

While various embodiments of the present disclosure may be described below, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described exemplary embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such condi- That which is claimed is:

1. A parking infrastructure system comprising:
   a first sensor;
   a second sensor;
   a processor; and
   a memory storing computer-executable instructions, that when executed by the processor, cause the processor to:
   receive location information about the first sensor and the second sensor;
   receive a trigger of the first sensor by a vehicle;
   receive a trigger of the second sensor by the vehicle;
   determine, based on the trigger of the first sensor and the trigger of the second sensor, that a first place exists between a location of the first sensor and a location of the second sensor;
   add the first place to a representation of the parking infrastructure system, the representation of the parking infrastructure system comprising a Petri Net model;
   receive data representing that at least one parking spot of the infrastructure system is occupied even though the at least one parking spot is empty; and
   send a digital twin of the representation to a processor of either the vehicle or another vehicle, the digital twin being a digital representation of the parking infrastructure system and showing that the at least one parking spot is occupied, even though the at least one parking spot is empty.

2. The system of claim 1, wherein the trigger of the first sensor and the trigger of the second sensor comprise a determination that the vehicle is identified by the first sensor or the second sensor.

3. The system of claim 1, wherein the computer-executable instructions further comprise:
   provide the representation of the parking infrastructure system to the vehicle.

4. The system of claim 1, wherein the computer-executable instructions further comprise:
   identify a trigger of a third sensor by the vehicle;
   receive, from the vehicle, an indication that the vehicle is either ascending or descending;
   identify a trigger of a fourth sensor by the vehicle; and
   determine, based on the trigger of the third sensor, the trigger of the fourth sensor, and the indication that the vehicle is either ascending or descending, that the third sensor is associated with a first level of the parking infrastructure system and the fourth sensor is associated with a second level of the parking infrastructure system, the second level being either above or below the first level.

5. The system of claim 1, wherein the computer-executable instructions further comprise:
   receive, from the vehicle, information about an action taken by the vehicle including at least one of: taking a right turn, taking a left turn, engaging a parking gear, and
   engaging a non-parking gear.

6. The system of claim 1, wherein the computer-executable instructions further comprise:
   determine, based on receiving the trigger of the first sensor, that the vehicle is located in the first place.

7. The system of claim 6, wherein the computer-executable instructions further comprise:
   determine, based on the vehicle being located in the first place, a number of vehicles located in the first place; and
   provide the number of vehicles in the first place to a at least one of: the parking infrastructure system and second vehicle.

8. The system of claim 1, wherein the computer-executable instructions further comprise:
   receive at least one of: a trigger of a third sensor by the vehicle and information associated with the vehicle; and
   send, based on receiving at least one of the trigger of a third sensor by the vehicle and information associated with the vehicle, an instruction for the vehicle to perform an action.

9. A method comprising:
   receiving location information about a first sensor and a second sensor;
   receiving a trigger of the first sensor by a vehicle;
   receiving a trigger of the second sensor by the vehicle;
   determining, based on the trigger of the first sensor and the trigger of the second sensor, that a first place exists between a location of the first sensor and a location of the second sensor;
   adding the first place to a representation of a parking infrastructure system, the representation of the parking infrastructure system comprising a Petri Net model;
   receiving data representing that at least one parking spot of the infrastructure system is occupied even though the at least one parking spot is empty; and
   sending a digital twin of the representation to a processor of either the vehicle or another vehicle, the digital twin being a digital representation of the parking infrastructure system and showing that the at least one parking spot is occupied, even though the at least one parking spot is empty.

10. The method of claim 9, wherein the trigger of the first sensor and the trigger of the second sensor comprise a determination that the vehicle is identified by the first sensor or the second sensor.

11. The method of claim 9, further comprising:
    providing the representation of the parking infrastructure system to the vehicle.

12. The method of claim 9, further comprising:
    identifying a trigger of a third sensor by the vehicle;
    receiving, from the vehicle, an indication that the vehicle is either ascending or descending;
    identifying a trigger of a fourth sensor by the vehicle; and
    determining, based on the trigger of the third sensor, the trigger of the fourth sensor, and the indication that the vehicle is either ascending or descending, that the third sensor is associated with a first level of the parking infrastructure system and the fourth sensor is associated with a second level of the parking infrastructure system, the second level being either above or below the first level.

13. The method of claim 9, further comprising:
    receiving, from the vehicle, information about an action taken from the vehicle including at least one of: taking a right turn, taking a left turn, engaging a parking gear, and
    engaging a non-parking gear.

14. The method of claim 9, further comprising:
    determining, based on receiving the trigger of the first sensor, that the vehicle is located in the first place.

15. The method of claim 14, further comprising:
- determining, based on the determination that the vehicle is located in the first place, a number of vehicles located in the first place; and
- providing the number of vehicles in the first place to a at least one of: the parking infrastructure system and second vehicle.

16. The method of claim 9, further comprising receiving at least one of: a trigger of a third sensor by the vehicle and information associated with the vehicle; and
- sending, based on receiving at least one of the trigger of a third sensor by the vehicle and information associated with the vehicle, an instruction for the vehicle to perform an action.

17. The system of claim 1, wherein the instructions of the memory, when executed by the processor, further cause the processor to receive other data corresponding to at least one other vehicle entering or leaving or leaving the parking infrastructure system, and update the digital twin in real-time based on the other data.

18. The system of claim 1, wherein the Petri Net model comprises a parking structure having a plurality of levels, an entrance, and an exit.

* * * * *